(12) United States Patent  
Chien et al.

(10) Patent No.: US 12,372,880 B2  
(45) Date of Patent: Jul. 29, 2025

(54) SYSTEM AND METHOD FOR DETECTING DEBRIS IN A PHOTOLITHOGRAPHY SYSTEM

(71) Applicant: Taiwan Semiconductor Manufacturing Co., Ltd., Hsinchu (TW)

(72) Inventors: Shang-Chieh Chien, Hsinchu (TW); Tzu-Jung Pan, Hsinchu (TW); Wei-Shin Cheng, Hsinchu (TW); Cheng Hung Tsai, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 619 days.

(21) Appl. No.: 17/750,151

(22) Filed: May 20, 2022

(65) Prior Publication Data

US 2023/0375944 A1    Nov. 23, 2023

(51) Int. Cl.  
*G03F 7/00*    (2006.01)

(52) U.S. Cl.  
CPC ........ *G03F 7/7065* (2013.01); *G03F 7/70033* (2013.01); *G03F 7/7085* (2013.01); *G03F 7/70025* (2013.01); *G03F 7/70041* (2013.01)

(58) Field of Classification Search  
CPC .. G03F 7/7065; G03F 7/70033; G03F 7/7085; G03F 7/70025; G03F 7/70041; G03F 7/70916  
USPC .......................................... 430/30  
See application file for complete search history.

(56) References Cited

U.S. PATENT DOCUMENTS

| | | | | |
|---|---|---|---|---|
| 2003/0184720 A1* | 10/2003 | Heerens | ................... | G03F 7/707 355/53 |
| 2011/0048452 A1* | 3/2011 | Zink | ......................... | B08B 7/00 134/1 |
| 2016/0320708 A1* | 11/2016 | Lu | ......................... | G03F 7/70025 |
| 2018/0224748 A1* | 8/2018 | Nagai | ...................... | G21K 1/06 |
| 2020/0064747 A1* | 2/2020 | Chien | ................... | G03F 7/70925 |
| 2022/0269182 A1* | 8/2022 | Chen | ......................... | G03F 7/709 |
| 2022/0299865 A1* | 9/2022 | Yang | ................... | G03F 7/70741 |
| 2023/0060598 A1* | 3/2023 | Chen | ................... | G03F 7/70941 |

\* cited by examiner

*Primary Examiner* — Caleen O Sullivan  
(74) *Attorney, Agent, or Firm* — Seed IP Law Group

(57) ABSTRACT

An extreme ultraviolet (EUV) photolithography system includes a scanner that directs the EUV light onto an EUV reticle. The photolithography system includes one or more contamination reduction structures positioned within the scanner and configured to attract and decompose contaminant particles within the scanner. The contamination reduction structure includes a surface material that is highly electronegative.

20 Claims, 10 Drawing Sheets

SYSTEM AND METHOD FOR DETECTING DEBRIS IN A PHOTOLITHOGRAPHY SYSTEM

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, it is possible that contaminants from the EUV generation process may enter the scanner and accumulate on sensitive optical surfaces within the scanner. This can result in corruption of the photolithography processes. The resulting integrated circuits may not be functional.

Figure 1:
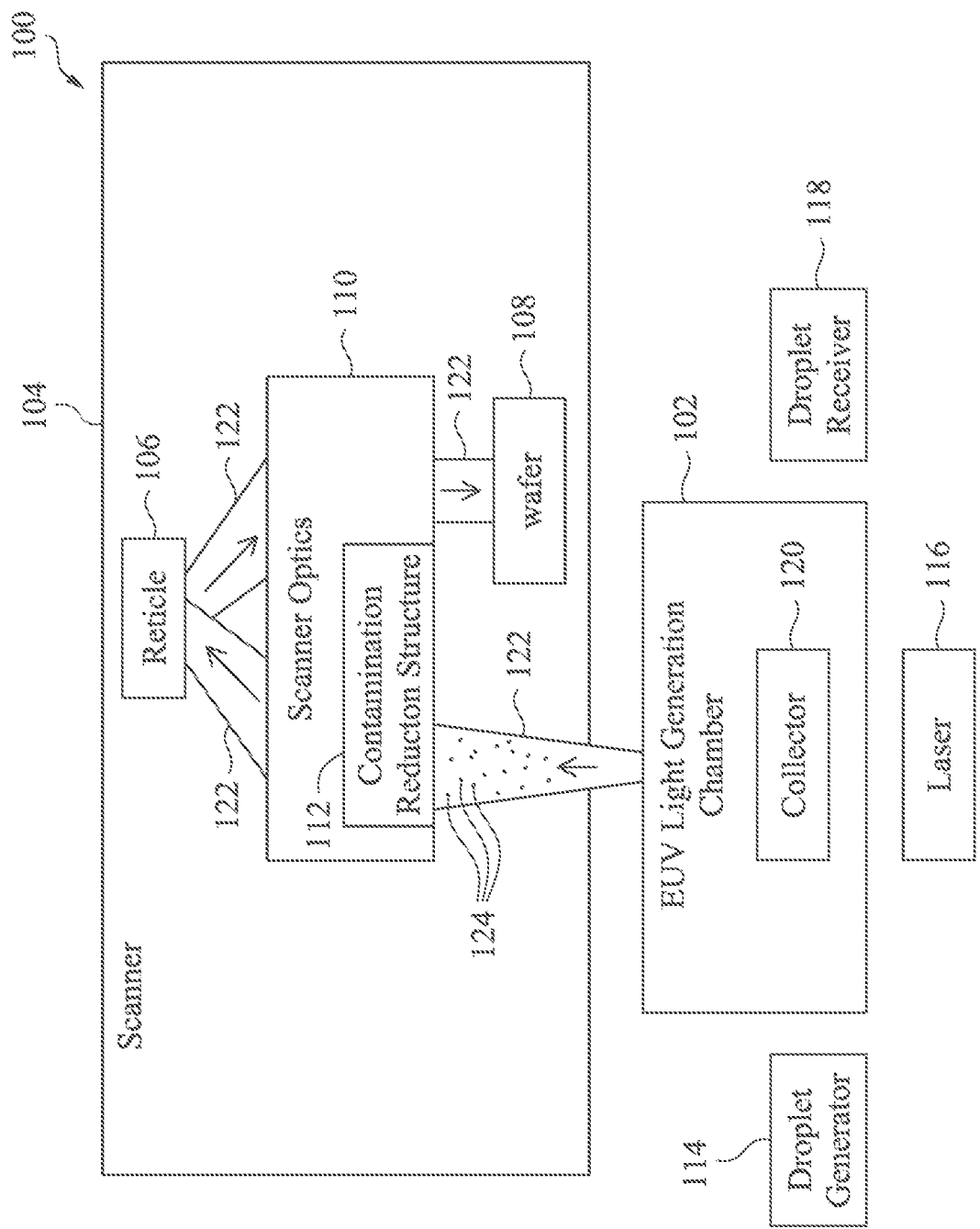
FIG. 1 is a block diagram of an EUV photolithography system, in accordance with some embodiments.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure utilize contamination reduction structures to reduce contamination of sensitive optical surfaces within the scanner of an EUV photolithography system. The contamination reduction structures can be placed adjacent to one or more sensitive optical surfaces within the scanner. A path of travel of the EUV light passes adjacent to the contamination reduction structures. The contamination reduction structures have a functional surface coating of a highly electronegative material that can attract contaminants and can facilitate decomposition of the contaminants before the contaminants can accumulate on the sensitive optical surfaces. The contamination reduction structures have relatively large surface areas for their overall volumes. The relatively large surface areas allow for capture and decomposition of large amounts of contaminants.

Embodiments of the present disclosure provide several benefits. Most particularly, contaminants are drawn to and are decomposed by the contamination reduction structures. This reduces the amount of contamination that accumulates on sensitive optical surfaces within the scanner. Because the sensitive optical surfaces remain clean, EUV photolithography processes can be performed without reduction in quality that can result from contamination. Furthermore, expensive and time-consuming cleaning processes can be avoided for the sensitive optical surfaces. This allows the EUV photolithography systems to remain in operation. Photolithography processes are performed without interruption and without corruption, leading to increases in wafer yields and better performance of integrated circuits.

FIG. 1 is a block diagram of an EUV photolithography system 100, according to some embodiments. The components of the EUV photolithography system 100 cooperate to generate EUV light and perform photolithography processes. As will be set forth in more detail below, the components of the photolithography system cooperate to reduce contamination of sensitive optical surfaces of during EUV light generation processes. As used herein, the terms "EUV light" and "EUV radiation" can be used interchangeably.

The EUV photolithography system 100 includes an EUV light generation chamber 102 and the scanner 104. A reticle 106 is placed within the scanner. The EUV light generation chamber 102 generates EUV light and passes the EUV light into the scanner 104. The scanner 104 directs the EUV light onto the reticle 106 and from the reticle 106 onto a wafer 108. Further details regarding this process are described below.

The EUV photolithography system 100 includes a droplet generator 114, a laser 116, and a droplet receiver 118. The droplet generator 114 outputs droplets into the EUV light generation chamber 102. The laser 116 irradiates the droplets with pulses of laser light within the EUV light generation chamber 102. The irradiated droplets emit EUV light 122. The EUV light 122 is collected by a collector 120 and reflected toward the scanner 104. The scanner 104 conditions the EUV light 122, reflects the EUV light 122 off of the reticle 106 including a mask pattern, and focuses the EUV light 122 onto the wafer 108. The EUV light 122 patterns a layer on the wafer 108 in accordance with a pattern of the reticle 106. Each of these processes is described in more detail below.

The droplet generator 114 generates and outputs a stream of droplets. The droplets can include tin, though droplets of other material can be utilized without departing from the scope of the present disclosure. The droplets move at a high rate of speed toward the droplet receiver 118. The droplets have an average velocity between 60 m/s to 200 m/s. The droplets have a diameter between 10 μm and 200 μm. The generator may output between 1000 and 100000 droplets per second. The droplet generator 114 can generate droplets having different initial velocities and diameters than those described above without departing from the scope of the present disclosure.

In some embodiments, the EUV light generation chamber 102 is a laser produced plasma (LPP) EUV light generation system. As the droplets travel through the EUV light generation chamber 102 between the droplet generator 114 and the droplet receiver 118, the droplets are irradiated by the laser 116. When a droplet is irradiated by the laser 116, the energy from the laser 116 causes the droplet to form a plasma. The plasmatized droplets generate EUV light 122. This EUV light 122 is collected by the collector 120 and passed to the scanner 104 and then on to the wafer 108.

In some embodiments, the laser 116 is positioned external to the EUV light generation chamber 102. During operation, the laser 116 outputs pulses of laser light into the EUV light generation chamber 102. The pulses of laser light are focused on a point through which the droplets pass on their way from the droplet generator 114 to the droplet receiver 118. Each pulse of laser light is received by a droplet. When the droplet receives the pulse of laser light, the energy from the laser pulse generates a high-energy plasma from the droplet. The high-energy plasma outputs EUV light 122.

In some embodiments, the laser 116 irradiates the droplet with two pulses. A first pulse causes the droplet to flatten into a disk like shape. The second pulse causes the droplet to form a high temperature plasma. The second pulse is significantly more powerful than the first pulse. The laser 116 and the droplet generator 114 are calibrated so that the laser emits pairs of pulses such that the droplet is irradiated with a pair of pulses. The laser can irradiate droplets in a manner other than described above without departing from the scope of the present disclosure. For example, the laser 116 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 120 to collect the scattered EUV light 122 from the plasma and direct or output the EUV light 122 toward the scanner 104.

The scanner 104 includes scanner optics 110. The scanner optics 110 include a series of optical conditioning devices to direct the EUV light 122 to the reticle. The scanner optics 110 may include refractive optics such as a lens or a lens system having multiple lenses (zone plates). The scanner optics 110 may include reflective optics, such as a single mirror or a mirror system having multiple mirrors. The scanner optics 110 direct the ultraviolet light from the EUV light generation chamber 102 to the reticle 106.

The EUV light 122 includes a pattern from the reticle 106. In particular, the reticle 106 includes the pattern to be defined in the wafer 108. After the EUV light 122 reflects off of the reticle, the EUV light 122 contains the pattern of the reticle. A layer of photoresist typically covers the target during extreme ultraviolet photolithography irradiation. The photoresist assists in patterning a surface of the semiconductor wafer in accordance with the pattern of the reticle.

The effectiveness of the photolithography processes depends, in part, on the amount of EUV light 122 that is generated, how much of the EUV light 122 reaches the reticle 106, and how effectively the EUV light 122 carries the pattern of the reticle 106 after reflecting from the reticle 106. If any of these aspects of the photolithography process are negatively affected, then the photolithography process itself may be less effective or ineffective.

There are various factors that can reduce the amount of EUV light 122 that reaches the wafer 108. One such factor is contamination of the collector 120. In particular, when the laser 116 irradiates the droplets within the EUV light generation chamber 102, droplet particles may accumulate on the collector 120. As the droplet particles accumulate on the collector 120, the amount of EUV light 122 reflected by the collector 120 is reduced. Various efforts are made to reduce the accumulation of droplet particles on the collector 120. One such effort is to flow a cleaning gas onto the collector 120. The cleaning gas is selected to react with the material of the droplets. This cleaning gas may result in the gaseous compound of the droplet material and the gas.

In one example, the droplets are tin (Sn) and the cleaning gas is hydrogen (H) gas. The hydrogen reacts with tin and forms a gaseous compound SnH4. Other droplet materials, cleaning gases, and resulting gases compounds can be utilized without departing from the scope of the present disclosure and may form gaseous compounds that ultimately may contaminate surfaces of the collector or scanner optics.

While the cleaning process described above may result in removal of droplet material from the surface of the collector 120, some of the resulting gaseous compound may flow into the scanner 104. The gaseous compound is a contaminant. As described previously, the scanner 104 includes scanner optics 110. The scanner optics 110 include optical surfaces, such as lenses and mirrors, that direct the EUV light 122 toward the reticle 106. The gaseous compound or other contaminants may contaminate the optical surfaces by depositing onto the optical surfaces. The contamination of the optical surfaces can result in a reduction in the amount of EUV light 122 that reaches the reticle 106. Furthermore, contamination of the optical surfaces can eventually results in removal of the contaminated optical surfaces for cleaning. These cleaning processes can be very expensive and time-consuming. The EUV photolithography system 100 cannot be operated while the scanner optics 110 are being cleaned. FIG. 1 illustrates contaminants 124 traveling within the scanner 104.

One potential solution is to flow a large amount of cleaning gas across the optical surfaces of the scanner optics 110 during operation of the EUV photolithography system 100. This can reduce the accumulation of contaminants on the optical surfaces. However, this has the drawback of also reducing the amount of EUV light 122 that reaches the reticle 106 and the wafer 108. This is because some amount of the EUV light 122 is either absorbed or scattered by a large flow of the cleaning gas.

Embodiments of the present disclosure are able to reduce contamination of the optical surfaces without significantly reducing the amount of EUV light 122 that reaches the reticle 106 and the wafer 108. In particular, the EUV photolithography system 100 includes one or more contamination reduction structures 112 within the scanner optics 110. The contamination reduction structures 112 attract, capture, and/or decompose contaminants within the scanner 104. Because the contamination reduction structures attract, capture, and/or decompose contaminants, the contaminants do not accumulate on the optical surfaces of the scanner optics 110.

Contamination reduction structures 112 in accordance with embodiments of the present disclosure include a surface material that is selected to attract contaminants. In some embodiments, the surface material also catalyzes decomposition of the contaminants. Decomposition of the contaminants results in byproducts including droplet material and gas. The droplet material remains on the surface of the contamination reduction structures. The gas is harmless to the scanner optics 110 and does not result in contamination of the scanner optics 110.

In an example in which the contaminants include SnH4, decomposition results in the byproducts Sn and hydrogen gas, e.g., $H_2$. The Sn is captured and accumulates on the surface of the contamination reduction structures 112. The $H_2$ is pumped out of the scanner 104 without harming the scanner optics 110.

In some embodiments, the surface material of the contamination reduction structure 112 is highly electronegative. The electronegativity of the surface material refers to the tendency of that material to attract shared electrons when forming a chemical bond. The higher the electronegativity of the material, the more the material attracts electrons. This can result in attractive electromagnetic forces that draw compounds prone to form a covalent bond by sharing an electron. Because the surface material of the contamination reduction structure 112 is highly electronegative, the contaminants are attracted to the surface of the contamination reduction structure 112.

Examples of surface materials include metals and transition metals capable of attracting, capturing and/or decomposing the contaminants. In some embodiments, the surface material of the contamination reduction structure 112 has electronegativity greater than or equal to 1.9 (electronegativity is unitless). Materials with such values of electronegativity may attract and capture contaminants to such a degree that little or none of the contaminants are not attracted and captured by the contamination reduction structure and therefore, little or none of the contaminants are available to accumulate on the optical surfaces of the scanner optics 110. The surface material of the contamination reduction structure 112 may also be selected to bond with the droplet material, thereby promoting retention of the droplet material resulting from decomposition of the contaminant compound on or in the contamination reduction structure. The surface material of the contamination reduction structure 112 may include nickel (Ni, electronegativity of 1.9), ruthenium (Ru, electronegativity of 2.2), gold (Au, electronegativity of 2.4), tungsten (W, electronegativity of 2.36), platinum (Pt, electronegativity of 2.33), palladium (Pd, electronegativity of 2.2), lead (Pb, electronegativity of 2.33), rhodium (Rh, electronegativity of 2.28), molybdenum (Mo, electronegativity of 2.16), or other materials with relatively high electronegativity capable of attracting, capturing and/or decomposing contaminants. Various materials and combination of materials can be utilized for the surface material of the contamination reduction structures 112 without departing from the scope of the present disclosure.

In some embodiments, the contamination reduction structure 112 has a relatively large surface area compared to the volume of the contamination reduction structures 112. This can be accomplished in several ways. For example, the contamination reduction structure 112 may include a porous material. Porous materials have a very large surface areas. One example of a porous material is foam. Foams are highly porous and therefore have very large surface areas. Foams can include ceramic materials, metal materials, or other hard materials. If the material of the foam is not electronegative, then the foam can be coated with an electronegative material. This can be accomplished by evaporation, physical vapor deposition (PVD), or chemical vapor deposition (CVD). The thickness of the electronegative material should be on an order that does not fill the pores. In one example, the thickness of the electronegative material is between 1 nm and 100 nm, though other thicknesses can be utilized without departing from the scope of the present disclosure.

In some embodiments, the contamination reduction structure 112 may include a plurality of nanorods. A contamination reduction structure 112 including a material made of nanorods separated from each other by small gaps will have a very high surface area. The nanorods may have a length between 5 nm and 100 nm, though other lengths can be utilized without departing from the scope of the present disclosure. The nanorods may be formed from ceramic materials, metal materials, or other hard materials. If the material of the nanorods is not highly electronegative, then the nanorods can be coated with an electronegative surface coating of the type described above. As described above, the surface coating can be deposited by evaporation, CVD, or PVD. Alternatively, the contamination reduction structure 112 may include nanofibers of an electronegative material or nanofibers coated with an electronegative material.

In some embodiments, the contamination reduction structure includes a polycrystalline film. The polycrystalline film may have a relatively large grain sizes. The grain sizes may be between 20 nm and 100 nm, though other grain sizes can be utilized without departing from the scope of the present disclosure. Such large grain sizes may result in very large surface areas. The polycrystalline film may be formed of ceramic materials, metal materials, or other hard materials. If the polycrystalline film is not highly electronegative, then the polycrystalline film can be coated in an electronegative material of the type described above.

In some embodiments, the contamination reduction structure 112 includes silicon covered in ruthenium. The ruthenium surface material may naturally include protrusions separated by gaps which results in a relatively high surface area.

The contamination reduction structures 112 may surround a portion of the travel path of the EUV light 122 within the scanner 104. As the light 122 passes through the apertures in the contamination reduction structures 112, the flow of contaminants may also pass through the apertures and adjacent to the functional surfaces of the contamination reduction structures 112. Because the contaminants pass adjacent to the functional surfaces of the contamination reduction structures 112, the contaminants are captured and decomposed by the contamination reduction structures 112. The contamination reduction structures 112 may be fixed to individual optical directors (mirrors, lenses, etc.) within the scanner 104.

The contamination reduction structures 112 may be fixed or otherwise placed adjacent to an intermediate focus corresponding to an aperture in the scanner 104 through which EUV light 122 and contaminants pass into the scanner 104. A contamination reduction structure 112 in such a location may result in capture of a large portion of contaminants entering the scanner 104. Contamination reduction structures 112 may be placed in other locations or configurations without departing from the scope of the present disclosure.

Figure 2:
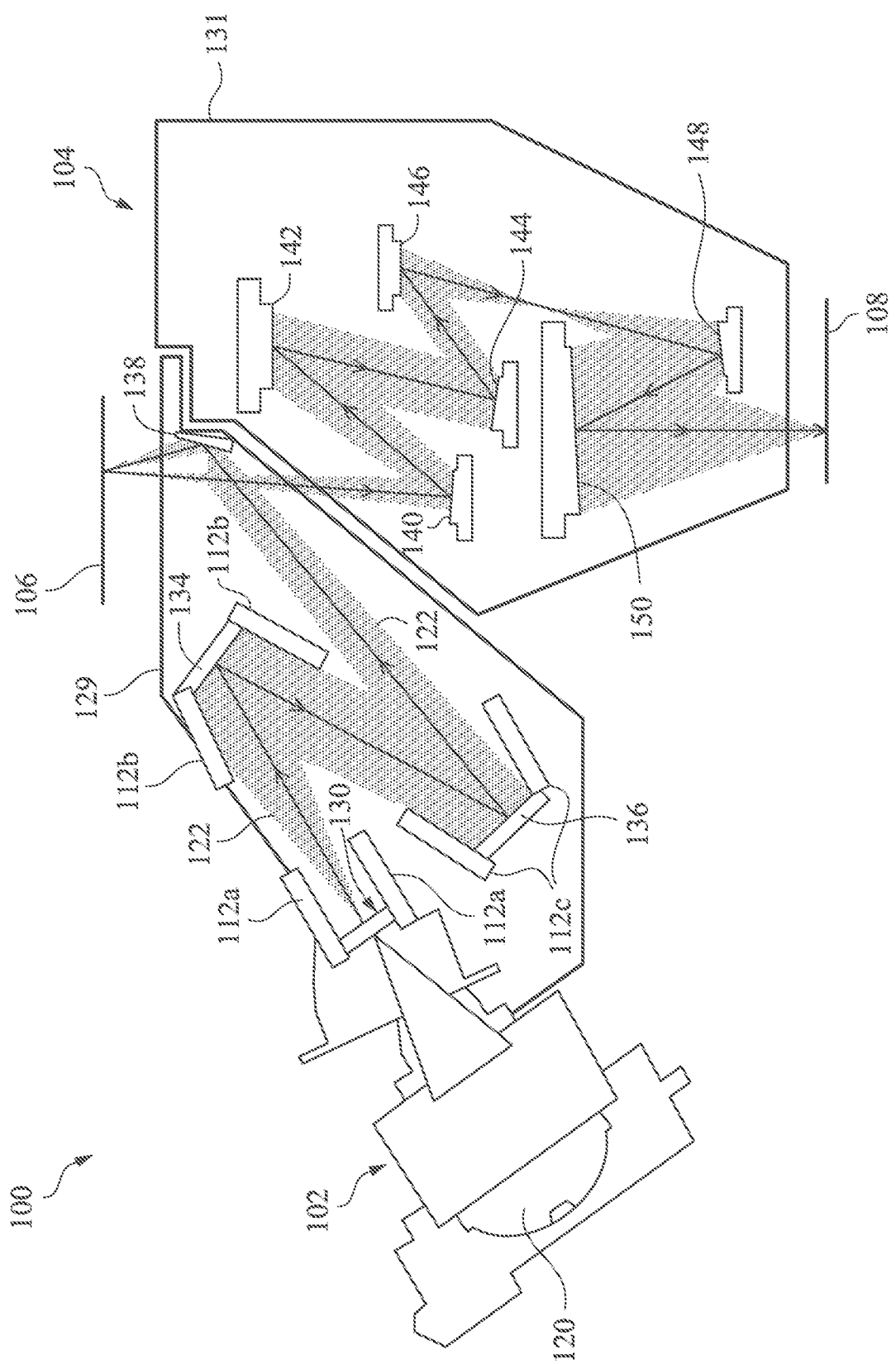
FIG. 2 is an illustration of an EUV photolithography system, in accordance with some embodiments.

FIG. 2 is an illustration of an EUV photolithography system 100, in accordance with some embodiments. The EUV photolithography system 100 includes an EUV generation chamber 102, a scanner 104, and a reticle 106. As described in relation to FIG. 1, EUV light 122 is generated in the EUV light generation chamber 102, passed into the scanner 104, directed to the reticle 106, reflected from the reticle 106, and directed to a wafer 108.

The scanner 104 includes an illuminator 129 and the projector 131. The illuminator 129 corresponds to the portion of the scanner 104 through which the EUV light 122 travels before reaching the reticle 106. The projector 131 corresponds to the portion of the scanner 104 through which the EUV light 122 travels toward the wafer 108 after reflecting from the reticle 106.

The illuminator 129 includes an aperture 130 through which EUV light 122 passes from the EUV light generation chamber 102 into the scanner 104. The illuminator 129 also includes a first mirror 134, a second mirror 136, and a third mirror 138. The mirrors 134, 136, and 138 correspond to optical surfaces that reflect or redirect the EUV light 122 as the EUV light 122 travels through the illuminator 129 to the reticle 106. The illuminator 129 may include other components and configurations of components for directing the EUV light 122 from the EUV light generation chamber 102 to the reticle 106 without departing from the scope of the present disclosure.

The projector 131 includes mirrors 140, 142, 144, 146, 148, and 150. The mirrors 140, 142, 144, 146, 148, and 150 may act as lensing mirrors in that the mirrors 140-150 have curved surfaces. The projector 131 may include other components and configurations of components for directing EUV light 122 from the reticle 106 to the wafer 108 without departing from the scope of the present disclosure.

After the EUV light 122 passes through the aperture 130, the EUV light 122 travels toward the mirror 134. The mirror 134 reflects the EUV light 122. The EUV light 122 can travel from the mirror 134 to the mirror 136. The mirror 136 reflects the EUV light 122 toward the mirror 138. The mirror 138 reflects the EUV light 122 onto the reticle 106. The EUV light 122 reflects off of the reticle 106 and carries a pattern of the reticle 106. The EUV light 122 then enters the projector 131. The EUV light 122 reflects, in sequence, off of the mirror 140, off of the mirror 142, off the mirror 144, off of the mirror 146, off of the mirror 148, off of the mirror 150, and onto the wafer 108. The EUV light 122 carries the pattern of the reticle 106 and thereby patterns a layer on the wafer 108.

Because the illuminator 129 of the scanner 104 is directly coupled to the EUV light generation chamber 102 via the aperture 130, contaminants may easily travel from the EUV light generation chamber 102 into the illuminator 129 via the aperture 130. The surfaces of the mirrors 134 and 136 may be particularly susceptible to impact from contaminants from the EUV light generation chamber 102. If contaminants accumulate on the surfaces of the mirrors 134 and 136, then the reflectivity of the mirrors 134 and 136 may decrease. This results in a smaller amount of EUV light 122 making it to the reticle 106.

In order to reduce or prevent contamination of the mirrors 134 and 136, the illustrated embodiment of an EUV light generation system 100 in accordance with the present disclosure includes contamination reduction structures 112a, 112b and 112c within the illuminator 129. As described in relation to FIG. 1, the contamination reduction structures 112a-112c have a functional surface material configured to attract, capture, and/or decompose contaminant compounds. The contamination reduction structures 112a-112c may have materials and configurations as described in relation to FIG.

1. The illuminator 129 may include a different number of contamination reduction structures 112 than are shown in FIG. 2. The illuminator 129 may include different shapes and sizes of contamination reduction structures 112 than are shown in FIG. 2. The illuminator 129 may include contamination reduction structures 112 in other locations than are shown in FIG. 2.

The EUV photolithography system 100 includes a contamination reduction structure 112a positioned in the illuminator 129 adjacent to the aperture 130. The aperture 130 may be formed in a planar surface of the illuminator 129. The contamination reduction structure 112a may be coupled or fixed to the planar surface surrounding the aperture 130. The coupling or fixing may include the use of adhesives, screws, bolts, or other types of fasteners or coupling devices.

Placement of the contamination reduction structure 112a surrounding and in near proximity to the aperture 130 may be highly advantageous. This is because all contaminants that pass from the EUV light generation chamber 102 into the illuminator 129 will pass through the aperture 130. Placement of the contamination reduction structure 112a at this location may result in capture and decomposition of a high percentage of contaminants that enter the illuminator 129.

Though not apparent in FIG. 2, the contamination reduction structure 112a may have a shape of a cylinder or a frustum placed around a portion of the path of travel of the EUV light 122. Accordingly, the contamination reduction structure 112a may have a first aperture and a second aperture. The first aperture is positioned proximal to the aperture 130. The second aperture is positioned distal from the aperture 130.

The EUV photolithography system 100 includes a contamination reduction structure 112b positioned adjacent to the mirror 134. The contamination reduction structure 112b may be coupled to the mirror 134 or to a structure that supports the mirror 134. Alternatively, the contamination reduction structure 112b may be supported by a support structure separate from the mirror 134.

Placement of the contamination reduction structure 112b in close proximity to the mirror 134 may be very beneficial. Due to the composition of the surface material of the contamination reduction structures 112 as described in relation to FIG. 1, any contamination particles that approach the mirror 134 will be more attracted to the surface material of the contamination reduction structure 112b than to the mirror 134. The result is that contamination compounds will be captured and decomposed by the surface material of the contamination reduction structure 112b rather than impacting and accumulating on the mirror 134.

The contamination reduction structure 112b may have a shape of a cylinder or frustum. The contamination reduction structure 112b may have a first aperture and a second aperture. The second aperture is directly coupled to or positioned adjacent to the mirror 134. When EUV light 122 passes from the aperture 130 to the mirror 134, the EUV light 122 will first pass through the first aperture of the contamination reduction structure 112b. The EUV light 122 will then reflect off of the mirror 134 (perhaps briefly passing through the second aperture of the contamination reduction structure 112b) and travel out through the first aperture of the contamination reduction structure 112b toward the mirror 136.

The EUV photolithography system 100 includes a contamination reduction structure 112c positioned adjacent to the mirror 136. The contamination reduction structure 112c may be coupled to the mirror 136 or to a structure that supports the mirror 136. Alternatively, the contamination reduction structure 112c may be supported by a support structure separate from the mirror 136.

Placement of the contamination reduction structure 112c in close proximity to the mirror 136 may be very beneficial. Due to the composition of the surface material of the contamination reduction structures 112 as described in relation to FIG. 1, any contamination particles that approach the mirror 136 will be more attracted to the surface material of the contamination reduction structure 112c than to the mirror 136. The result is that contamination compounds will be captured and decomposed by the surface material of the contamination reduction structure 112c rather than impacting and accumulating on the mirror 136.

The contamination reduction structure 112c may have a shape of a cylinder or frustum. The contamination reduction structure 112c may have a first aperture and a second aperture. The second aperture is directly coupled to or positioned adjacent to the mirror 136. When EUV light 122 reflects off the mirror 134 and travels toward the mirror 136, the EUV light 122 will first pass through the first aperture of the contamination reduction structure 112c. The EUV light 122 will then reflect off of the mirror 136 (perhaps briefly passing through the second aperture of the contamination reduction structure 112c) and travel out through the first aperture of the contamination reduction structure 112c toward the mirror 138.

Figure 3A:
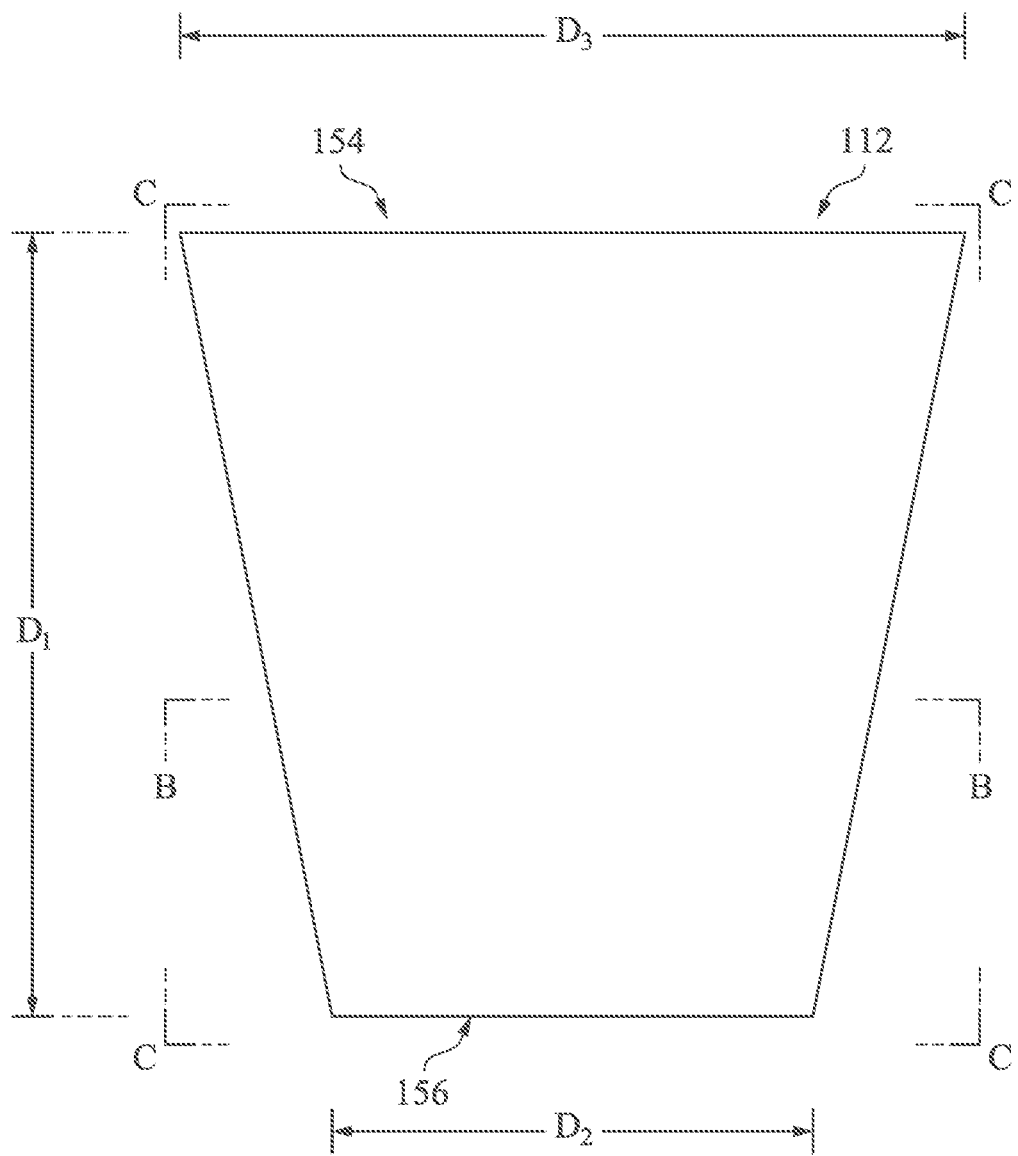
FIG. 3A-3C are various views of a contamination reduction structure, in accordance with some embodiments.

FIG. 3A is a side view of a contamination reduction structure 112, in accordance with some embodiments. The contamination reduction structure 112 is one example of contamination reduction structures that can be utilized in an EUV photolithography system 100 as described in relation to FIGS. 1 and 2. The contamination reduction structure 112 may also be used in other photolithography systems than those shown in FIGS. 1 and 2.

The contamination reduction structure 112 has a first dimension D1. The first dimension D1 may correspond to a length of the contamination reduction structure 112. The value of the dimension D1 may be selected in accordance with the particular size and configuration of a scanner 104 in which the contamination reduction structure 112 will be placed. In one example, the dimension D1 is between 5 cm and 30 cm, though other values may be utilized without departing from the scope of the present disclosure.

The contamination reduction structure 112 may have a dimension D2. The dimension D2 may correspond to the width or diameter of the contamination reduction structure 112 at a first end of the contamination reduction structure 112. In one example, the dimension D2 is between 2 cm and 10 cm, though other values may be utilized without departing from the scope of the present disclosure.

The contamination reduction structure 112 may have a dimension D3. The dimension D3 may correspond to the width or diameter of the contamination reduction structure 112 at a second end of the contamination reduction structure 112. One example, the dimension D3 is between 5 cm and 20 cm, though other values may be utilized without departing from the scope of the present disclosure. When the dimensions D1, D2 and D3 are in the ranges described above, the functional coating or functional material of the contamination reduction structure is able to attract and decompose contaminants.

The contamination reduction structure 112 has an aperture 154 at one end, and an aperture 156 at the opposite end. The nature of the apertures 154 and 156 will be more apparent in the view of FIG. 3C.

Figure 3B:
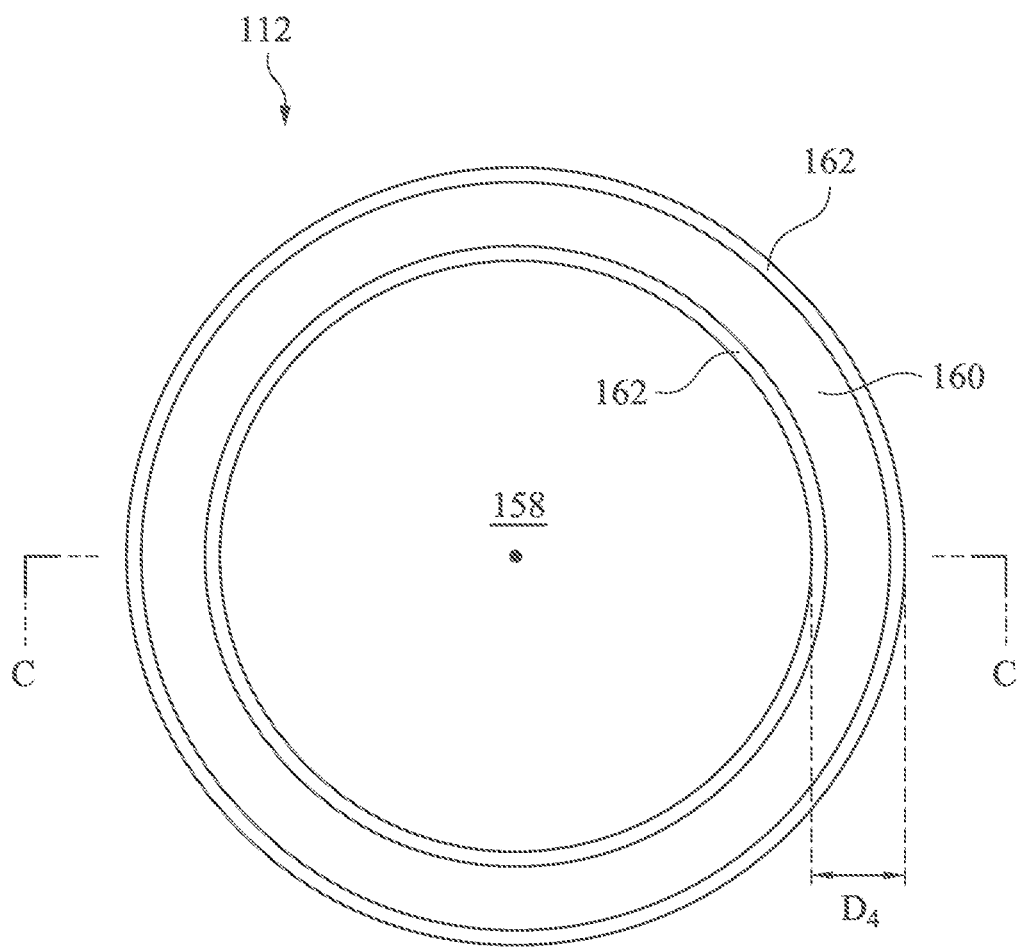
Figure 3C:
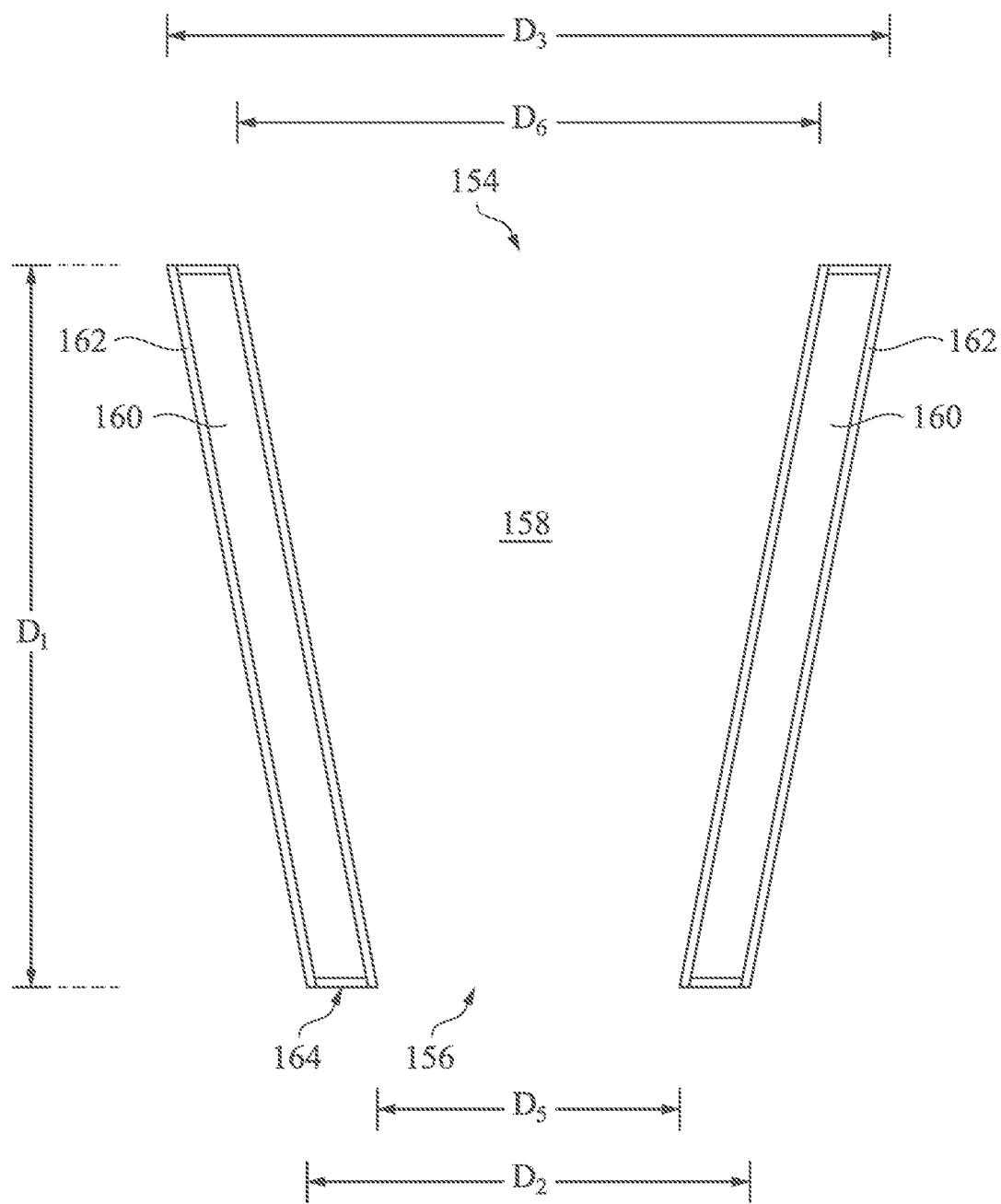

The contamination reduction structure 112 has the shape of a hollow frustum, though this will be more apparent in the view of FIG. 3C. A frustum corresponds to the portion of the cone of a pyramid that remains after its upper part has been cut by two parallel planes. A frustum is the space which is intercepted between two such parallel planes. A frustum may have a circular cross-section, oval cross-section, a triangular cross section, a rectangular cross-section, polygonal cross-section, or other type of cross-section. A contamination reduction structure 112 may have a shapes other than a hollow frustum without departing from the scope of the present disclosure.

FIG. 3B is a cross-sectional view of the contamination reduction structure 112 of FIG. 3A taken along cut lines B, in accordance with some embodiments. The contamination reduction structure 112 has a circular cross-section, though other shapes can be utilized without departing from the scope of the present disclosure. The contamination reduction structure 112 has a body 160. The contamination reduction structure 112 has a functional coating 162 on the body 160. In the illustrated embodiment, the functional coating is on an inside surface and an outside surface of contamination reduction structure 112. In other embodiments, the functional coating is on one or the other of the inside surface and the outer surface of the contamination reduction structure. The functional coating includes an electronegative material as described in relation to FIG. 1. The functional coating 162 corresponds to the surface material of the contamination reduction structure 112 that attracts, captures, and/or decomposes contamination compounds as described in relation to FIG. 1.

The contamination reduction structure 112 has a dimension D4 corresponding to a thickness of the wall of the contamination reduction structure 112. The dimension D4 includes the functional coating 162. The dimension D4 may have a value between 0.5 cm and 3 cm, though other values may be utilized without departing from the scope of the present disclosure. In practice, the lateral thickness of the functional coating 162 may be less than 1 μm, though other values can be utilized without departing from the scope of the present disclosure. Accordingly, the dimension D4 substantially corresponds to the thickness of the body 160. When the dimension D4 is in the foregoing range, the wall of the contamination reduction structure provides the structural integrity to support the functional coating 162 and support the mounting of the contamination structure 112 as described above.

Although the contamination reduction structure 112 is shown as having a body 160 and a functional coating 162, in practice, the body 160 may include the functional electronegative surface material that attracts and decomposes contaminant compounds. In this case, an additional functional coating 162 may not be present.

The contamination reduction structure 112 defines an interior channel 158. The EUV light 122 will pass through the interior channel 158 as it travels through the illuminator 129 toward the reticle 106.

FIG. 3C is a cross-sectional view of the contamination reduction structure 112 of FIG. 3A taken along cut plane C, in accordance with some embodiments. FIG. 3C illustrates that the contamination reduction structure 112 is a hollow frustum. The contamination reduction structure 112 has an aperture 154 and an aperture 156. The aperture 156 has a dimension D5, corresponding to the diameter of the aperture 156. The dimension D5 may be between 2 cm and 9 cm, though other values may be utilized without departing from the scope of the present disclosure. The aperture 154 has a dimension D6 corresponding to the diameter of the aperture 154. The dimension D6 has a value between 4 cm and 19 cm, though other values can be utilized without departing from the scope of the present disclosure. When the dimensions D5 and D6 are in these ranges, the contamination reduction structure does not negatively impact light that is passing through the contamination reduction structure. In addition, contamination reduction structures with these dimensions can be readily mounted on existing tool structures.

FIG. 3C illustrates that the functional coating 162 covers all surfaces of the body 160. However, in some embodiments, the functional coating 162 may cover only interior surfaces of the body 160. FIG. 3C illustrates that the interior channel 158 extends between the apertures 154 and 156. A surface 164 surrounds the aperture 156.

FIGS. 4A-4E illustrate surface topographies of various contamination reduction structures 112, in accordance with some embodiments. The contamination reduction structures 112 of FIGS. 4A-4D have relatively large surface areas compared to the volume of the contamination reduction structures 112. For example, in some embodiments, the surface area to volume ratio ranges from 1 to $10^6$ mm$^2$ per 1 mm$^3$. In FIGS. 4A-4E, the contamination reduction structures 112 may have a thin coating of the functional material described in relation to FIGS. 1-3C. The coating is sufficiently thin that the high surface area remains. In other embodiments, the contamination reduction structures of FIGS. 4A-4E are formed from the functional materials described above.

Figure 4C:
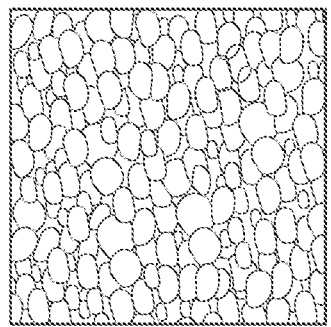
FIGS. 4A-4E are illustrations of various types of surfaces of the contamination reduction structure, in accordance with some embodiments.
Figure 4B:
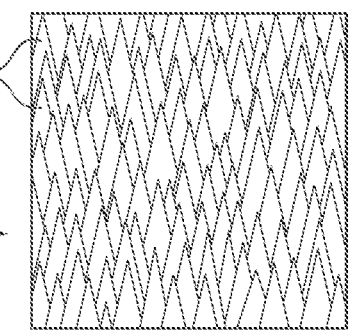
Figure 4A:
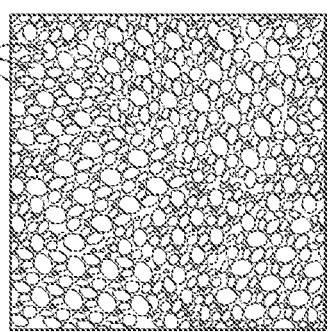

FIG. 4A illustrates a porous contamination reduction structure 112 with random pores. In particular, the contamination reduction structure 112 includes a plurality of random pores 170. Porous materials in FIG. 4A have a very large surface areas. One example of a porous material with random pores is foam. Foams are highly porous and therefore have very large surface areas. Porous contamination structures 112 can be formed from ceramic materials, metal materials, or other hard materials.

In FIG. 4B, the contamination reduction structure 112 includes a plurality of nanorods 172. A material made of nanorods separated from each other by small gaps will have a very high surface area. The nanorods may have a length between 5 nm and 100 nm, though other lengths can be utilized without departing from the scope of the present disclosure. The nanorods 172 may be formed from ceramic materials, metal materials, or other hard materials.

In FIG. 4C, the contamination reduction structure 112 includes a polycrystalline film. The polycrystalline film may have a relatively large grain size. The grain sizes may be between 20 nm and 100 nm, though other grain sizes can be utilized without departing from the scope of the present disclosure. Such large grain sizes may result in very large surface areas. The polycrystalline film can be formed from ceramic materials, metal materials, or other hard materials.

Figure 4E:
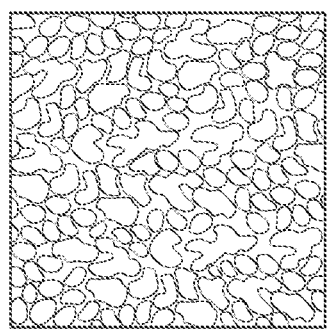
Figure 4D:
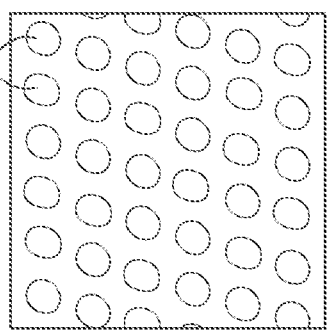

In FIG. 4D, the contamination reduction structure 112 includes a non-random pattern of pores 170. Although the contamination reduction structure 112 of FIG. 4D is porous as in FIG. 4A, the contamination reduction structure 112 of FIG. 4D includes pores that are regularly spaced and sized rather than irregularly spaced and sized pores in FIG. 4A.

In FIG. 4E, the contamination reduction structure 112 includes a silicon substrate covered with ruthenium. The ruthenium surface material naturally includes protrusions separated by gaps which contribute to a relatively high surface area for the contamination reduction structure of FIG. 4E.

Figure 5:
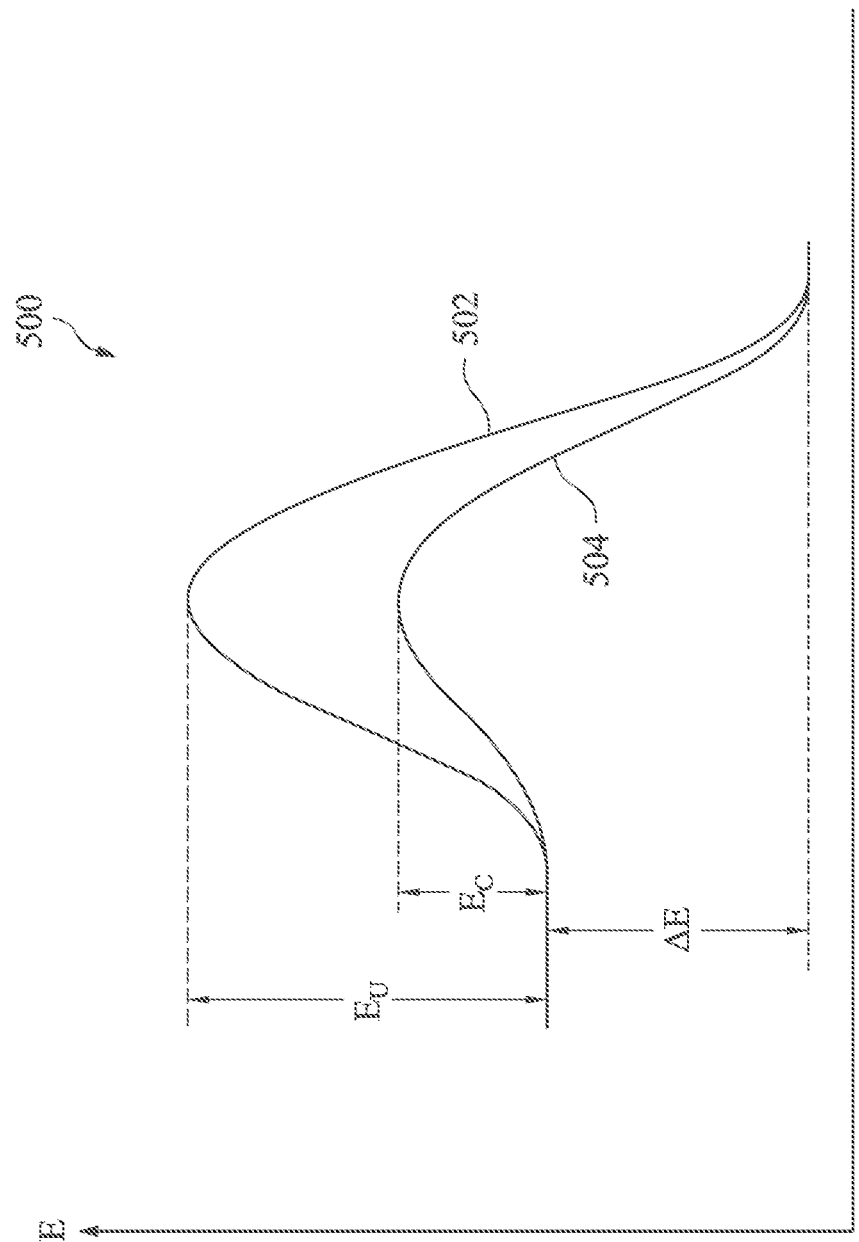
FIG. 5 is a graph illustrating energy properties of functional services, in accordance with some embodiments.

FIG. 5 illustrates a graph 500 of the potential energy of the decomposition of a contamination compound, e.g., SnH4, in accordance with some embodiments. At the left side of the graph, the contamination compound has not yet reacted with the functional surface material. The graph 502 illustrates the potential energy needed for an uncatylized reaction that decomposes the contamination compound. The graph 504 illustrates the potential energy needed for a catalyzed reaction that decomposes the contamination compound. Accordingly, the graph 504 corresponds to a reaction of the contamination compound with the electronegative functional material of the contamination reduction structure 112 of the presently described embodiments. The graph 502 corresponds to a reaction of the contamination compound in the absence of a catalyst or with a catalyst that has an electronegativity different from the electronegativity of functional materials of the present disclosure. Accordingly, the graph 500 illustrates the lower energy needed for the reaction with electronegative functional material of the present disclosure and the decomposition of the contaminants. At the right side of the graph, the contamination compound has been decomposed. In one example, the contamination compound is $SnH_4$ at the left end of the graph. At the right of the graph, the contamination compound has been decomposed into $Sn+2H_2$.

Figure 6:
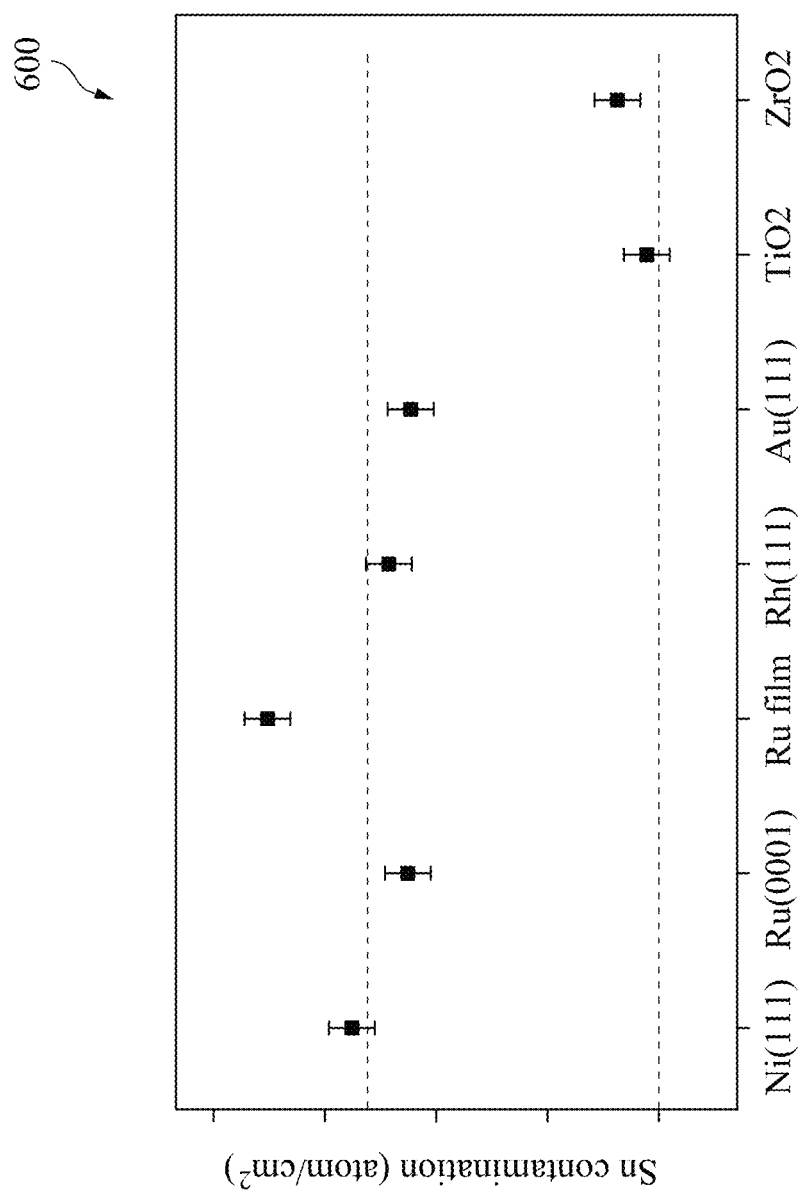
FIG. 6 is a graph illustrating contamination accumulation for various functional surfaces, in accordance with some embodiments.

FIG. 6 is a graph 600 illustrating Sn contamination accumulation on various types of surface materials, in accordance with some embodiments. The different surface materials include functional materials in accordance with the present disclosure including, highly electronegative materials such as Ni, crystalline Ru (001), noncrystalline Ru, crystalline, Rh (111), and crystalline Au (111) and materials TiO2 and ZrO2 that are not highly electronegative materials and are not functional materials of the present disclosure. In each of these cases, accumulation of Sn resulting from capture and decomposition of SnH4 compounds is greater for highly electronegative functional materials of the present disclosure and significantly lower for $TiO_2$ and $ZrO_2$ which are not highly electronegative functional materials of the present disclosure. Higher levels of accumulation correspond to higher rates of attracting, capturing, and/or decomposing contaminants by functional materials of the present disclosure.

Figure 7:
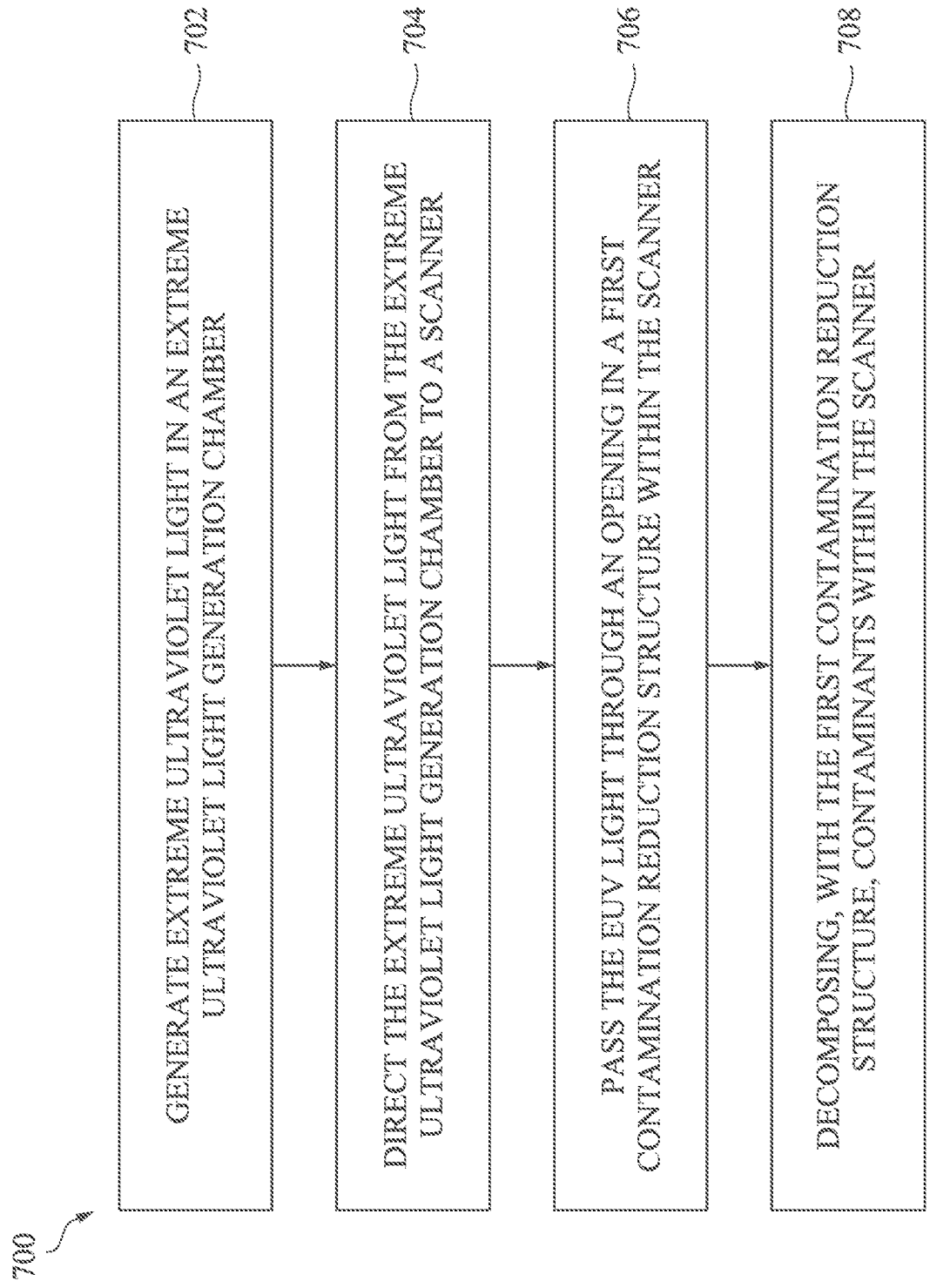
FIG. 7 is a flow diagram of a method for operating an EUV photolithography system, in accordance with some embodiments.

FIG. 7 is a flow diagram of a method 700, in accordance with some embodiments. The method 700 can utilize processes, components, and systems described in relation to FIGS. 1-6. At 702, the method 700 includes generating extreme ultraviolet light in an extreme ultraviolet light generation chamber. One example of an extreme ultraviolet light generation chamber is the extreme ultraviolet light generation chamber 102 of FIG. 1. At 704, the method 700 includes directing the extreme ultraviolet light from the extreme ultraviolet light generation chamber to a scanner. One example of a scanner is the scanner 104 of FIG. 1. At 706, the method 700 includes passing the EUV light through an opening in a first contamination reduction structure within the scanner. One example of a first contamination reduction structure is the first contamination reduction structure 112a of FIG. 2. At 708, the method 700 includes decomposing contaminants, with the first contamination reduction structure, within the scanner. One example of contaminants are the contaminants 124 of FIG. 1.

Figure 8:
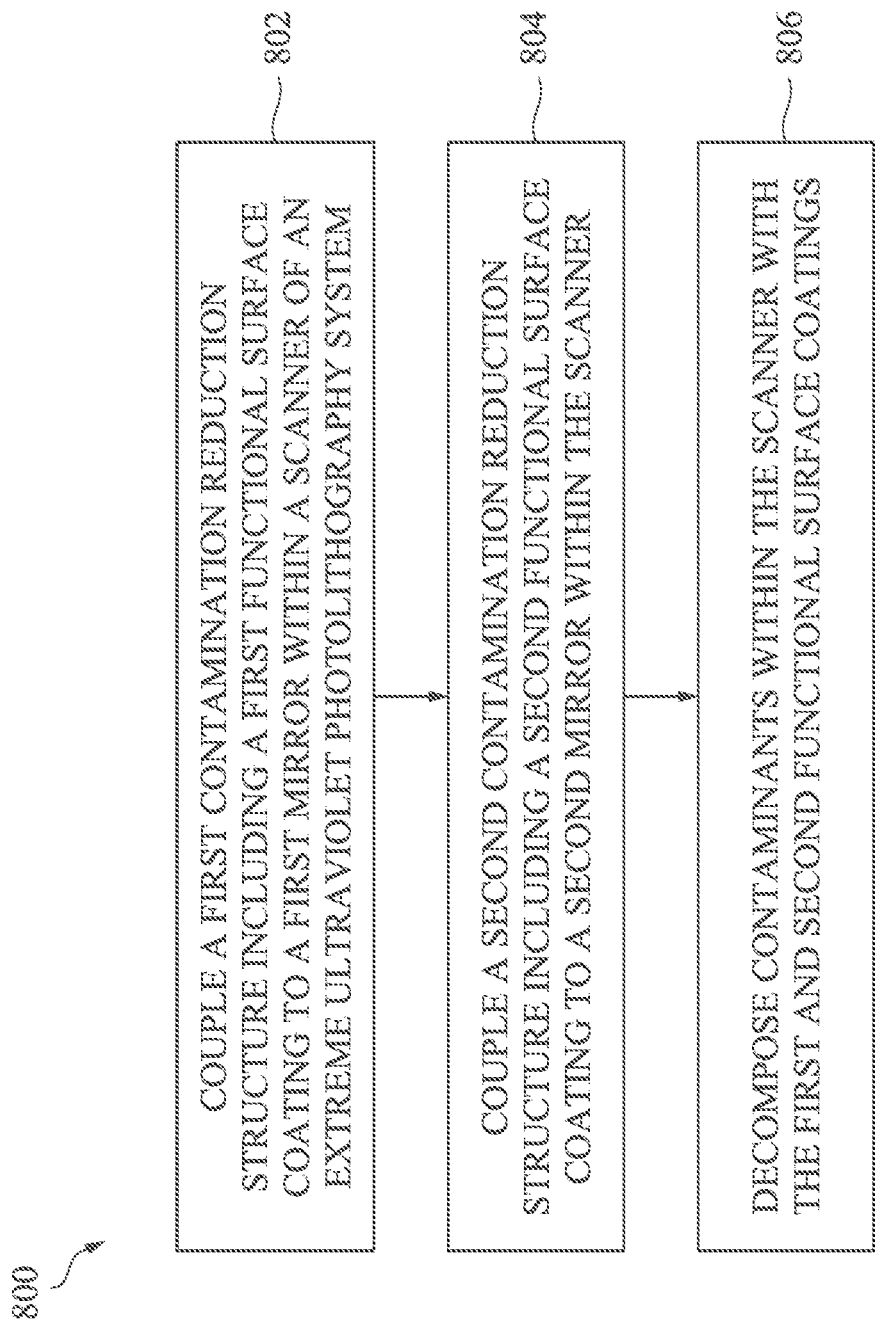
FIG. 8 is a flow diagram of a method for operating an EUV photolithography system, in accordance with some embodiments.

FIG. 8 is a flow diagram of a method 800, in accordance with some embodiments. The method 800 can utilize processes, components, and systems described in relation to FIGS. 1-7. At 802, the method 800 includes coupling a first contamination reduction structure including a first functional surface coating to a first mirror within a scanner of an extreme ultraviolet photolithography system. One example of a first contamination reduction structure is the contamination reduction structure 112b of FIG. 2. One example of a first mirror is the mirror 134 of FIG. 2. One example of a scanner is the scanner 104 of FIG. 2. One example of an EUV photolithography system is the EUV photolithography system 100 of FIG. 2. One example of a first functional surface coating is the surface coating 162 of FIG. 3C. At 804, the method 800 includes coupling a second contamination reduction structure including a second functional surface coating to a second mirror within the scanner. One example of a second contamination reduction structure is the contamination reduction structure 112C of FIG. 2. One example of a second layer is the mirror 136 of FIG. 2. At 806, the method 800 includes decomposing contaminants within the scanner with the first and second functional surface coatings. One example of contaminants is the contaminants 124 of FIG. 1.

Embodiments of the present disclosure utilize contamination reduction structures to reduce contamination of sensitive optical surfaces within the scanner of an EUV photolithography system. The contamination reduction structures can be placed adjacent to one or more sensitive optical surfaces within the scanner. A path of travel of the EUV light passes adjacent to the contamination reduction structures. The contamination reduction structures have a functional surface coating of a highly electronegative material that can attract contaminants and can facilitate decomposition of the contaminants before the contaminants can accumulate on the sensitive optical surfaces. The contamination reduction structures have a relatively large surface areas for their overall volumes. The relatively large surface areas allow for capture and decomposition of large amounts of contaminants.

Embodiments of the present disclosure provide several benefits. Most particularly, contaminants are drawn to and are decomposed by the contamination reduction structures. This reduces the amount of contamination that accumulates on sensitive optical surfaces within the scanner. Because the sensitive optical surfaces remain clean, EUV photolithography processes can be performed without reduction in quality that can result from contamination. Furthermore, expensive and time-consuming cleaning processes can be avoided for the sensitive optical surfaces. This allows the EUV photolithography systems to remain in operation. Photolithography processes are performed without interruption and without corruption, leading to increases in wafer yields and better performance of integrated circuits.

In some embodiments, a method includes generating extreme ultraviolet light in an extreme ultraviolet light generation chamber and directing the extreme ultraviolet light from the extreme ultraviolet light generation chamber to a scanner. The method includes passing the extreme ultraviolet light through an opening in a first contamination reduction structure within the scanner and decomposing, with the first contamination reduction structure, contaminants within the scanner.

In some embodiments, a method includes coupling a first contamination reduction structure including a first functional surface coating to a first mirror within a scanner of an extreme ultraviolet photolithography system and coupling a second contamination reduction structure including a second functional surface coating to a second mirror within the scanner. The method includes decomposing contaminants within the scanner with the first and second functional surface coatings.

In some embodiments, a photolithography system includes an extreme ultraviolet light generation chamber and a scanner coupled to the extreme ultraviolet light generation chamber and configured to receive extreme ultraviolet light from the extreme ultraviolet light generation chamber. The system includes a first contamination reduction structure within the scanner and surrounding a travel path of the extreme ultraviolet light within the scanner and configured to decompose contaminants within the scanner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a substrate with photoresist;
    generating extreme ultraviolet light in an extreme ultraviolet light generation chamber;
    directing the extreme ultraviolet light from the extreme ultraviolet light generation chamber to a scanner;
    passing the extreme ultraviolet light through an opening in a first contamination reduction structure within the scanner;
    decomposing, with the first contamination reduction structure, contaminants within the scanner; and
    irradiating the photoresist with the extreme ultraviolet light.

2. The method of claim 1, comprising generating the extreme ultraviolet light by irradiating droplets within the extreme ultraviolet light generation chamber, wherein the contaminants include a compound having material from the droplets, wherein the contamination reduction structure includes a surface material configured to facilitate decomposition of the compound.

3. The method of claim 2, comprising trapping the material from the droplets with the surface material.

4. The method of claim 2, wherein the droplets include Sn.

5. The method of claim 2, wherein the compound includes SnH4 and the contamination reduction structure decomposes the compound into Sn and H2, wherein the Sn remains on the surface material after decomposition of the compound.

6. A method, comprising:
    coupling a first contamination reduction structure including a first functional surface coating to a first mirror within a scanner of an extreme ultraviolet photolithography system;
    coupling a second contamination reduction structure including a second functional surface coating to a second mirror within the scanner; and
    decomposing contaminants within the scanner with the first and second functional surface coatings.

7. The method of claim 6, comprising:
    generating extreme ultraviolet light by irradiating droplets in an extreme ultraviolet light generation chamber;
    passing the extreme ultraviolet light from the extreme ultraviolet light generation chamber through a first aperture in the first contamination reduction structure onto the first mirror; and
    reflecting the extreme ultraviolet light from the first mirror through a second aperture in the second contamination reduction structure onto the second mirror.

8. The method of claim 7, wherein the decomposing the contaminants include catalyzing dissociation of the contaminants with the first and second functional surface coatings.

9. A method, comprising:
    generating extreme ultraviolet light in an extreme ultraviolet light generation chamber;
    passing the extreme ultraviolet light to a scanner;
    passing the extreme ultraviolet light from the scanner onto a wafer; and
    decomposing contaminants with a first decontamination reduction structure surrounding a travel path of the extreme ultraviolet light within the scanner coupled to the extreme ultraviolet light generation chamber.

10. The photolithography system of claim 9, further comprising receiving the extreme ultraviolet light into scanner from the extreme ultraviolet light generation chamber via an aperture, wherein the first contamination reduction structure surrounds the aperture.

11. The method of claim 9, further comprising redirecting the extreme ultraviolet light within the scanner with a first optical director, wherein the first contamination reduction structure is coupled to the first optical director.

12. The method of claim 11, further comprising:
    redirecting the extreme ultraviolet light within the scanner with a second optical director within the scanner; and
    decomposing contaminants within the scanner with a second contamination reduction structure coupled to the second optical director and surrounding the travel path of the extreme ultraviolet light.

13. The method of claim 9, wherein the first contamination reduction structure includes a surface material configured to attract and decompose the contaminants.

14. The method of claim 13, wherein the surface material has an electronegativity greater than 1.9.

15. The method of claim 14, wherein the surface material includes one or more of Ni, Ru, and Au.

16. The method of claim 13, wherein the first contamination reduction structure includes a plurality of nanorods covered in the surface material.

17. The method of claim 13, wherein the first contamination reduction structure includes a foam covered in the surface material.

18. The method of claim 13, wherein the first contamination reduction structure includes a polycrystalline film covered in the surface material.

19. The method of claim 13, wherein the first contamination reduction structure includes an electronegative material with a porous surface.

20. The method of claim 9, wherein the first contamination reduction structure is a frustum.

* * * * *